(12) United States Patent
Richter et al.

(10) Patent No.: US 12,727,298 B2
(45) Date of Patent: Sep. 1, 2026

(54) OPTOELECTRONIC SEMICONDUCTOR LAYER SEQUENCE AND OPTOELECTRONIC SEMICONDUCTOR DEVICE

(71) Applicant: ams-OSRAM International GmbH, Regensburg (DE)

(72) Inventors: Daniel Richter, Bad Abbach (DE); Gunnar Petersen, Regensburg (DE)

(73) Assignee: AMS-OSRAM INTERNATIONAL GMBH, Regensburg (DE)

( * ) Notice: Subject to any disclaimer, the term of this patent is extended or adjusted under 35 U.S.C. 154(b) by 348 days.

(21) Appl. No.: 18/691,153

(22) PCT Filed: Sep. 12, 2022

(86) PCT No.: PCT/EP2022/075287
§ 371 (c)(1),
(2) Date: Mar. 12, 2024

(87) PCT Pub. No.: WO2023/041484
PCT Pub. Date: Mar. 23, 2023

(65) Prior Publication Data
US 2024/0379912 A1 Nov. 14, 2024

(30) Foreign Application Priority Data
Sep. 14, 2021 (DE) ..................... 10 2021 123 702.5

(51) Int. Cl.
*H10H 20/824* (2025.01)
*H10H 20/851* (2025.01)

(52) U.S. Cl.
CPC ...... *H10H 20/8512* (2025.01); *H10H 20/824* (2025.01)

(58) Field of Classification Search
CPC ............. H10H 20/8512; H10H 20/824; H10H 20/854; H10H 20/84
See application file for complete search history.

(56) References Cited

U.S. PATENT DOCUMENTS

| | | | | |
|---|---|---|---|---|
| 6,879,610 | B2 * | 4/2005 | Alphonse | H10H 20/042 372/49.01 |
| 2012/0098015 | A1 | 4/2012 | Kraeuter | |
| 2015/0270455 | A1 | 9/2015 | Naasani et al. | |
| 2016/0284931 | A1 | 9/2016 | Tangring et al. | |
| 2017/0025574 | A1 | 1/2017 | Eckert et al. | |

FOREIGN PATENT DOCUMENTS

| | | | |
|---|---|---|---|
| DE | 10 2014 206 995 | A1 | 10/2015 |
| WO | 2010145893 | A2 | 12/2010 |
| WO | 2015074950 | A1 | 5/2015 |

OTHER PUBLICATIONS

Adams, R. (Authorized officer), International Search Report and Written Opinion in corresponding International Application No. PCT/EP2022/075287 mailed on Jan. 26, 2023, 10 pages.

* cited by examiner

*Primary Examiner* — David Vu
(74) *Attorney, Agent, or Firm* — MH2 Technology Law Group LLP

(57) ABSTRACT

The invention relates to an optoelectronic semiconductor layer sequence comprising:—an active layer for generating radiation, and—at least one filter layer configured to at least partially absorb the electromagnetic radiation generated by the active layer of wavelengths smaller than a predetermined cutoff wavelength. The invention also relates to an optoelectronic semiconductor device.

15 Claims, 3 Drawing Sheets

OPTOELECTRONIC SEMICONDUCTOR LAYER SEQUENCE AND OPTOELECTRONIC SEMICONDUCTOR DEVICE

CROSS-REFERENCE TO RELATED APPLICATIONS

The present application is a national stage entry from International Application No. PCT/EP2022/075287, filed on Sep. 12, 2022, published as International Publication No. WO 2023/041484 A1 on Mar. 23, 2023, and claims priority to German Patent Application No. 10 2021 123 702.5, filed Sep. 14, 2021, the disclosures of all of which are hereby incorporated by reference in their entireties.

FIELD

An optoelectronic semiconductor layer sequence and an optoelectronic semiconductor device are disclosed.

BACKGROUND

It is at least one object of certain embodiments to provide an optoelectronic semiconductor layer sequence and an optoelectronic semiconductor device having an improved emission spectrum.

SUMMARY

According to at least one embodiment, the optoelectronic semiconductor layer sequence comprises an active layer for generating electromagnetic radiation.

In particular, the active layer for generating electromagnetic radiation is arranged between a p-doped semiconductor layer and an n-doped semiconductor layer. The active layer is preferably configured to generate spontaneous emission. For example, the optoelectronic semiconductor layer sequence is formed to be a light-emitting diode. For example, during operation, the active layer emits electromagnetic radiation in an infrared spectral range.

The active layer comprises a multiple quantum well structure, for example. For the purposes of this application, the term quantum well structure includes, without limitation, any structure in which charge carriers may undergo quantization of their energy states through confinement. In particular, the term quantum well structure does not include any indication as to the dimensionality of the quantization. Therefore it includes, without limitation: quantum wells, quantum wires and quantum dots and any combination of these structures.

The optoelectronic semiconductor layer sequence comprises a III/V compound semiconductor material, for example. A III/V compound semiconductor material includes at least one element from the third main group, such as B, Al, Ga, In, and one element from the fifth main group, such as N, P, As. In particular, the term "III/V compound semiconductor material" comprises the group of binary, ternary or quaternary compounds that contain at least one element from the third main group and at least one element from the fifth main group, for example nitride and phosphide compound semiconductors. Such a binary, ternary or quaternary compound may also comprise, for example, one or more dopants and additional devices.

In particular, the semiconductor layer sequence comprises an arsenide compound semiconductor material, wherein the semiconductor layer sequence or at least a part thereof, particularly preferably at least the active layer, preferably comprises $Al_nGa_mIn_{1-n-m}As$, where $0 \leq n \leq 1$, $0 \leq m \leq 1$, and $n+m \leq 1$. This material does not necessarily need to have a mathematically exact composition according to the above formula. Rather, it may comprise one or more dopants and additional components. However, for the sake of simplicity, the above formula only includes the essential components of the crystal lattice (Al or As, Ga, In), even if these may be partially replaced by small amounts of further substances.

The optoelectronic semiconductor layer sequence is produced, in particular, by an epitaxial growth process.

According to at least one further embodiment, the optoelectronic semiconductor layer sequence comprises at least one filter layer configured to at least partially absorb the electromagnetic radiation generated by the active layer of wavelengths smaller than a predetermined cutoff wavelength.

The filter layer may, in particular, be produced by an epitaxial growth process. The filter layer may be grown epitaxially onto the active layer, with further layers being able to be produced epitaxially between the active layer and the filter layer. The filter layer and the active layer are then formed to be monolithically integrated.

For example, the filter layer absorbs more than 90% of the electromagnetic radiation of wavelengths smaller than the predetermined cutoff wavelength. Preferably, the electromagnetic radiation absorbed by the filter layer is not entirely converted into heat, but is at least partially re-emitted by the filter layer at or near the cutoff wavelength. This allows the efficiency of the optoelectronic semiconductor layer sequence to be increased. Throughout this specification, efficiency of the optoelectronic semiconductor layer sequence refers to a ratio between a power of the electromagnetic radiation emitted during operation and an electrical power that is supplied to the semiconductor layer sequence to generate electromagnetic radiation.

A high-energy portion of the electromagnetic radiation emitted during operation results from a radiative recombination of high-energy electron-hole pairs in the active layer. In the active layer, electron-hole pairs are preferably excited by external energy supply, in particular by applying an electrical current. The high-energy electron-hole pairs are generated, for example, by thermal activation and, in the case of high excitation, are facilitated by a high number of excited electron-hole pairs in the active layer. By at least partially absorbing the high-energy electromagnetic radiation in the filter layer, the number of electron-hole pairs in the active layer is reduced, for example, by an order of magnitude. In particular, this reduces the number of high-energy electron-hole pairs. The filter layer thus advantageously also leads to reduced generation of high-energy electromagnetic radiation in the active layer.

The optoelectronic semiconductor layer sequence may also comprise a plurality of filter layers, between which, for example, intermediate layers are arranged. The cutoff wavelength may be the same for different filter layers. Alternatively, cutoff wavelengths may differ for different filter layers, with the filter layers, in particular, comprising different semiconductor materials. In particular, the number of high-energy electron-hole pairs in the active layer may be reduced by using several filter layers.

According to one embodiment, the optoelectronic semiconductor layer sequence comprises:

an active layer for generating electromagnetic radiation, and at least one filter layer configured to at least partially absorb that electromagnetic radiation generated by the active layer of wavelengths smaller than a predetermined limit wavelength.

One concept of the optoelectronic semiconductor layer sequence described herein is to filter visible electromagnetic radiation, in particular, from the emission spectrum of a light-emitting diode. For example, light-emitting diodes of an emission spectrum centered around a wavelength of 940 nanometers in the infrared spectral range comprise a significant portion of emission in the still visible spectral range. For example, approximately 13% of the electromagnetic radiation emitted during operation is emitted at wavelengths less than or equal to 910 nanometers. Light-emitting diodes of this type are used, for example, to determine position or detect movement in the interior of vehicles. The portion of electromagnetic radiation emitted in the visible spectral range is perceived as a annoying reddish glow. In order to suppress this unwanted reddish glow, it proves to be advantageous to suppress or filter, for example, the proportion of electromagnetic radiation emitted in the visible spectral range.

The optoelectronic semiconductor layer sequence described herein is based, among other things, on the knowledge that a semiconductor material with a direct band gap, which is introduced into an optical path of the light-emitting diode, is particularly suitable for filtering. Semiconductor materials with a direct band gap exhibit a wavelength-dependent absorption coefficient having a sharp absorption edge. Electromagnetic radiation of a wavelength smaller than the absorption edge is particularly highly absorbed. For example, the absorption coefficient for gallium arsenide below the absorption edge may assume values around $10^{-6}$ per meter. That is, a filter layer having a thickness of, for example, one micrometer absorbs approximately 63% of the incident electromagnetic radiation of wavelengths smaller than the absorption edge. Thorughout this specification, “thickness” refers to an extension of the filter layer in the growth direction of the optoelectronic semiconductor layer sequence.

By appropriately aligning the direct band gap of the semiconductor material of the filter layer with the cutoff wavelength, a large part of the electromagnetic radiation of wavelengths smaller than the cutoff wavelength, for example more than 90%, may be filtered from the emission spectrum of the light-emitting diode. In the optoelectronic semiconductor layer sequence described herein, a filter layer, which in particular comprises a semiconductor material having a direct band gap, is introduced into the optoelectronic semiconductor layer sequence as early as during the epitaxial growth process.

An advantage of the optoelectronic semiconductor layer sequence described herein is that the electromagnetic radiation absorbed by the filter layer is not entirely converted into heat, but is at least partially re-emitted at or near the cutoff wavelength. This increases the efficiency of the optoelectronic semiconductor layer sequence. Furthermore, the filter layer reduces the number of electron-hole pairs in the active layer, which is why in particular less electromagnetic radiation of wavelengths smaller than the cutoff wavelength is emitted during operation.

According to at least one further embodiment of the optoelectronic semiconductor layer sequence, the cutoff wavelength is between 900 nanometers and 925 nanometers inclusive.

The optoelectronic semiconductor layer sequence preferably exhibits an emission spectrum that is centered around a wavelength of approximately 940 nanometers. The filter layer absorbs a large part of the electromagnetic radiation emitted in the visible spectral range, for example more than 90%, especially at wavelengths smaller than 910 nanometers.

According to at least one further embodiment of the optoelectronic semiconductor layer sequence, the at least one filter layer comprises a semiconductor material having a direct band gap.

Throughout this specification, a direct band gap refers to a minimum energetic distance between a valence band and a conduction band of the semiconductor material, with a maximum energy of the valence band and a minimum energy of the conduction band being at a same quasi-impulse or at a same wave vector. Semiconductor materials having a direct band gap exhibit a sudden increase in the absorption coefficient for electromagnetic radiation of wavelengths smaller than the wavelength that corresponds to the direct band gap. This makes semiconductor materials having a direct band gap particularly suitable as optical filters with a sharp absorption edge. Electron-hole pairs, created by absorbing photons of an energy greater than that of the band gap, have a short thermal relaxation time. For example, the electron-hole pairs relax to a minimum of the conduction band or to a maximum of the valence band within approximately 10 picoseconds. Radiative recombination of the electron-hole pairs may take place at that point, which recombination is, for example, two orders of magnitude slower than the thermal relaxation time. Thus, semiconductor materials having a direct band gap re-emit absorbed photons at least partially at an energy that approximately corresponds to the direct band gap.

Alternatively, the at least one filter layer may comprise a semiconductor material having an indirect band gap. In contrast to semiconductor materials having a direct band gap, semiconductor materials having an indirect band gap do not exhibit a sharp absorption edge. If the radiative recombination of the electron-hole pairs generated by absorption of electromagnetic radiation in the filter layer is not desirable, for example to suppress increased emission near the cutoff wavelength, a semiconductor material having an indirect band gap and low internal quantum efficiency may be used. For example, the internal quantum efficiency is less than 0.1. This means that only 10% of the electron-hole pairs generated by absorbing electromagnetic radiation recombine to emit electromagnetic radiation, while 90% of the electron-hole pairs recombine non-radiatively. Low internal quantum efficiency may be achieved, for example, by a high degree of impurity of the semiconductor material.

According to at least one further embodiment of the optoelectronic semiconductor layer sequence, the direct band gap is in a range which corresponds to a wavelength of electromagnetic radiation between 100% and 103% inclusive of the cutoff wavelength.

Since re-emission of the electromagnetic radiation absorbed by the filter layer occurs at a certain spectral width, the direct band gap preferably corresponds to a wavelength that is greater than the cutoff wavelength. For example, the cutoff wavelength is 910 nanometers, while the semiconductor material of the filter layer has a direct band gap corresponding to a wavelength between 915 and 920 nanometers inclusive.

According to at least one further embodiment of the optoelectronic semiconductor layer sequence, the filter layer comprises indium gallium arsenide, indium phosphide, in particular InxGa1-xAsyP1-y, with 0≤x≤1 and 0≤y≤1.

Indium gallium arsenide is a direct semiconductor the direct band gap of which may be adjusted by an indium content. In particular, indium gallium arsenide exhibits a direct band gap between approximately 1.4 electron volts for gallium arsenide and approximately 0.4 electron volts for indium arsenide. At an indium content of, for example, 5%, i.e. x=0.05 and y=1, the direct band gap is approximately 1.35 electron volts, corresponding to a wavelength of approximately 918 nanometers, and is therefore suitable for a filter layer having a cutoff wavelength of approximately 910 nanometers.

Indium phosphide is a direct semiconductor having a direct band gap of approximately 1.344 electron volts, corresponding to a wavelength of approximately 922 nanometers. Indium phosphide is therefore also suitable as a filter material for a filter layer having a cutoff wavelength of approximately 910 nanometers.

In order to ensure high crystal quality of the optoelectronic semiconductor layer sequence, strains within the optoelectronic semiconductor layer sequence should be avoided.

In particular, low crystal quality of the optoelectronic semiconductor layer sequence leads to increased non-radiative recombination of electron-hole pairs in the active layer and thus to low efficiency of the optoelectronic semiconductor layer sequence. In order to avoid such strains, a crystal structure of the filter layer is preferably aligned with a crystal structure of the active layer. For example, by using an indium gallium arsenide phosphide material system in the filter layer, a range of lattice constants between approximately 0.565 nanometers for gallium arsenide and 0.587 nanometers for indium phosphide may be covered.

According to at least one further embodiment of the optoelectronic semiconductor layer sequence, the at least one filter layer has a thickness of between 0.4 micrometers and 5 micrometers inclusive.

For example, gallium arsenide and indium phosphide exhibit absorption coefficients on the order of $10^{-6}$ per meter for photons of energies greater than that of the direct band gap. Due to the thickness of the filter layer between 1 micrometer and 5 micrometers, emission of electromagnetic radiation at wavelengths smaller than the cutoff wavelength may be reduced by more than an order of magnitude.

According to at least one embodiment of the optoelectronic semiconductor layer sequence, the at least one filter layer is arranged between two cladding layers.

The cladding layers are configured to electrically confine electron-hole pairs in the filter layer. The electron-hole pairs in the filter layer are generated in particular by absorbing electromagnetic radiation that is emitted by the active layer during operation. Electrical confinement of these electron-hole pairs increases the efficiency at which electron-hole pairs thermally relax within the filter layer and then recombine radiatively. Furthermore, the cladding layers are configured to confine the filter layer optically. Optical confinement reduces the probability of radiative recombination of electron-hole pairs at energies greater than the direct band gap. In particular, the cladding layers result in a higher probability of reabsorption of photons generated by radiative recombination in the filter layer. For example, the reabsorbed photons relax thermally and are then re-emitted at a lower energy.

According to at least one further embodiment of the optoelectronic semiconductor layer sequence, the cladding layers have a larger band gap than the filter layer.

The band gap of the cladding layers may be larger than band gaps of the filter layer and the active layer, in particular larger than band gaps of barrier layers of a quantum well structure or a multiple quantum well structure.

Furthermore, the cladding layers may have a band gap that is larger than band gaps of all other semiconductor layers of the optoelectronic semiconductor layer sequence.

Electron-hole pairs in the filter layer are created in particular by absorbing electromagnetic radiation generated during operation and not by applying an electrical current. Preferably, no transport of electrical charge carriers into the filter layer occurs. For this reason, the cladding layers may have a particularly large band gap. A larger band gap of the cladding layers leads to stronger electrical confinement of electron-hole pairs, which are generated by absorbing electromagnetic radiation, in the filter layer. The probability of radiative recombination in the filter layer may thus be increased and, in particular, the efficiency of the optoelectronic semiconductor layer sequence may be improved.

According to at least one further embodiment of the optoelectronic semiconductor layer sequence, the at least one filter layer is arranged between the active layer and a main surface of the optoelectronic semiconductor layer sequence, the main surface being configured to outcouple electromagnetic radiation generated during operation. In other words, the filter layer is arranged downstream of the active layer in the direction of emission of the electromagnetic radiation.

According to at least one further embodiment of the optoelectronic semiconductor layer sequence, a distance between the active layer and the filter layer is between 0 millimeters and 1 millimeter inclusive. In this context, the distance refers to a spatial extension between the active layer and the filter layer in the growth direction of the optoelectronic semiconductor layer sequence, in particular normal to a main extension plane of the semiconductor layers.

An optoelectronic semiconductor device is further disclosed. All of the features disclosed for the optoelectronic Semiconductor layer sequence are also disclosed for the optoelectronic semiconductor device. Conversely, all of the features disclosed for the optoelectronic semiconductor device are also disclosed for the optoelectronic semiconductor layer sequence.

According to at least one embodiment, the optoelectronic semiconductor device comprises a carrier which is configured to electrically contact at least one optoelectronic semiconductor chip.

According to at least one further embodiment, the optoelectronic semiconductor device comprises at least one optoelectronic semiconductor chip arranged on the carrier, which is configured to generate electromagnetic radiation and comprises a radiation outcoupling surface.

In particular, the optoelectronic semiconductor chip is a light-emitting diode, for example a flip chip, and preferably emits electromagnetic radiation in the infrared spectral range.

According to at least one further embodiment, the optoelectronic semiconductor device comprises a filter layer which is arranged at least on the radiation outcoupling surface and comprises a matrix material including semiconductor particles embedded therein, the semiconductor particles being configured to at least partially absorb the electromagnetic radiation generated during operation of a wavelength smaller than a cutoff wavelength.

The matrix material is preferably transparent to electromagnetic radiation generated during operation. The matrix material comprises, for example, a polymer, in particular silicone or an epoxy, and is applied, for example via a spray coating process, to the radiation outcoupling surface of the optoelectronic semiconductor chip.

The semiconductor particles are, in particular, configured to at least partially absorb electromagnetic radiation generated during operation in the visible spectral range and preferably comprise a semiconductor material having a direct band gap. In contrast to the filter layer of the optoelectronic semiconductor layer sequence, the semiconductor particles may comprise a semiconductor material the lattice structure of which is not aligned with the lattice structure of the semiconductor material of the optoelectronic semiconductor layer sequence. A semiconductor material having a suitable band gap may therefore be selected for the semiconductor particles, regardless of the semiconductor material comprising the optoelectronic semiconductor layer sequence.

According to one embodiment, the optoelectronic semiconductor device comprises:

- a carrier configured to electrically contact at least one optoelectronic semiconductor chip,
- at least one optoelectronic semiconductor chip for generating electromagnetic radiation, arranged on the carrier, the optoelectronic semiconductor chip comprising a radiation outcoupling surface,
- a filter layer arranged at least on the radiation outcoupling surface and comprising a matrix material including semiconductor particles embedded therein, and the semiconductor particles being configured to at least partially absorb electromagnetic radiation generated during operation of a wavelength smaller than a cutoff wavelength.

According to at least one further embodiment of the optoelectronic semiconductor device, the filter layer is formed as a potting which covers all of the surfaces of the optoelectronic semiconductor chip that are not covered by the carrier.

According to at least one further embodiment of the optoelectronic semiconductor device, the cutoff wavelength is between 900 nanometers and 920 nanometers inclusive.

In particular, the cutoff wavelength is selected such that electromagnetic radiation emitted by the optoelectronic semiconductor chip during operation in the visible spectral range is absorbed by the semiconductor particles. For optoelectronic semiconductor devices comprising an optoelectronic semiconductor chip which preferably exhibits an emission spectrum centered around a wavelength of 940 nanometers, the filter layer thus reduces the annoying reddish glow.

According to at least one further embodiment of the optoelectronic semiconductor device, the optoelectronic semiconductor chip comprises an optoelectronic semiconductor layer sequence described herein.

In particular, the optoelectronic semiconductor chip in this embodiment comprises an optoelectronic semiconductor layer sequence comprising a filter layer, in which the filter layer in particular comprises a semiconductor material having a direct band gap. By using a filter layer of the optoelectronic semiconductor device, for example one formed as a potting, electromagnetic radiation generated during operation may be filtered which is emitted, for example, via side surfaces of the optoelectronic semiconductor chip and is therefore not or not entirely filtered by the filter layer of the semiconductor chip. Furthermore, the semiconductor particles may comprise a semiconductor material that differs from the semiconductor material of the filter layer of the optoelectronic semiconductor layer sequence.

According to at least one further embodiment of the optoelectronic semiconductor device, the semiconductor particles have an average diameter of more than 1 micrometer.

In particular, the semiconductor particles are not nanoparticles and/or quantum dots. In other words, the semiconductor particles are macroscopic particles the band structure of which is not or only slightly influenced by an average diameter of the semiconductor particles.

According to at least one further embodiment of the optoelectronic semiconductor device, the semiconductor particles comprise a semiconductor material having a direct band gap.

Semiconductor materials having a direct band gap exhibit a sharp absorption edge and are therefore particularly suitable for absorbing electromagnetic radiation of wavelengths smaller than the cutoff wavelength, the direct band gap being approximately equal to the cutoff wavelength. According to at least one further embodiment of the optoelectronic semiconductor device, the semiconductor particles comprise indium gallium arsenide or indium phosphide.

Further advantageous embodiments and developments of the optoelectronic semiconductor layer sequence and the optoelectronic semiconductor device become apparent from the embodiments described below in conjunction with the figures.

DETAILED DESCRIPTION

In the figures, identical or similar elements or elements having the same effect bear the same reference symbols. The figures and the proportions of the elements shown in the figures relative to each other should not be considered to scale. Rather, individual elements, in particular layer thicknesses, may be shown in exaggeration for better representation and/or better understanding.

Figure 1A:
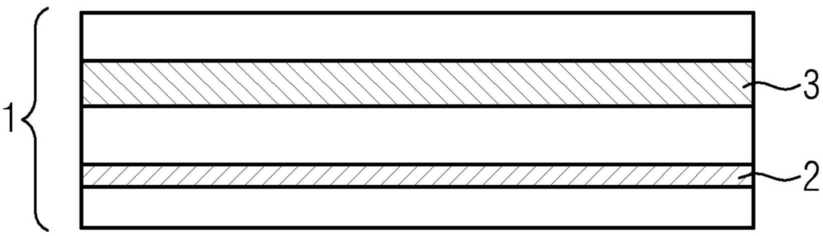
FIGS. 1A to 1C show schematic sectional views of optoelectronic semiconductor layer sequences according to various embodiments.

FIG. 1A shows a schematic sectional view of an optoelectronic semiconductor layer sequence 1 according to an embodiment. The optoelectronic semiconductor layer sequence 1 is configured as a light-emitting diode and comprises at least one p-doped semiconductor layer and at least one n-doped semiconductor layer. An active layer 2 is arranged inbetween and is configured to generate electromagnetic radiation. The active layer 2 preferably emits light in the infrared spectral range, the emission spectrum 13 being centered, for example, around a wavelength of 940 nanometers.

In order to filter annoying electromagnetic radiation in the visible spectral range from the emission spectrum 13 of the semiconductor layer sequence 1, a filter layer 3 is arranged in the semiconductor layer sequence 1. The filter layer 3 comprises a semiconductor material having a direct band gap which exhibits a sharp absorption edge. In particular, electromagnetic radiation of wavelengths that are smaller than the cutoff wavelength 14 is at least partially absorbed by the filter layer 3. The filter layer 3 has a thickness between 1 micrometer and 5 micrometers and absorbs at least 90% of the electromagnetic radiation emitted by the active layer 2 of wavelengths smaller than the cutoff wavelength 14. By absorbing short-wave electromagnetic radiation, electron-hole pairs are generated in the filter layer 3. These electron-hole pairs thermally relax and, through radiative recombination, emit electromagnetic radiation at a frequency at or near the direct band gap. Thus, electromagnetic radiation absorbed by the filter layer 3 is not entirely converted into heat, but is at least partially re-emitted at or near the cutoff wavelength 14. Furthermore, the filter layer 3 reduces the number of high-energy electron-hole pairs in the active layer 2, for example by an order of magnitude. As a result, in particular less light of wavelengths smaller than the cutoff wavelength 14 is emitted by the active layer 2.

Figure 1B:
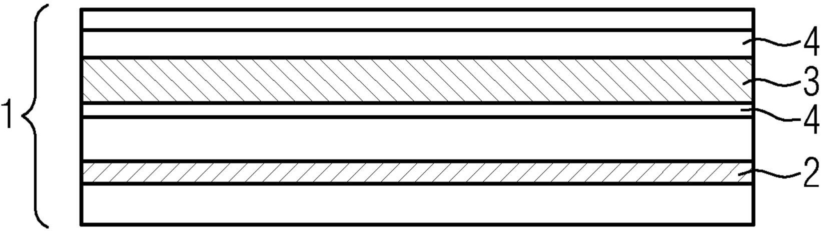

FIG. 1B shows a further embodiment of an optoelectronic semiconductor layer sequence 1. In contrast to FIG. 1A, the filter layer 3 is in this case arranged between two cladding layers 4. The cladding layers 4 serve both for electrically confining electron-hole pairs in the filter layer 3 and for optically confining electromagnetic radiation in the filter layer 3. This allows the efficiency of the optoelectronic semiconductor layer sequence 1 to be increased.

Preferably no transport of electrical charge carriers into the filter layer 3 occurs. In other words, electron-hole pairs in the filter layer are excited not by applying an electric current, but by absorbing electromagnetic radiation generated during operation. Since preferably no electrical transport of charge carriers into the filter layer occurs, the band gap of the cladding layers 4 may be chosen to be very large. In particular, the band gap of the cladding layers 4 is larger than the band gaps of all other layers of the optoelectronic semiconductor layer sequence 1.

Figure 1C:
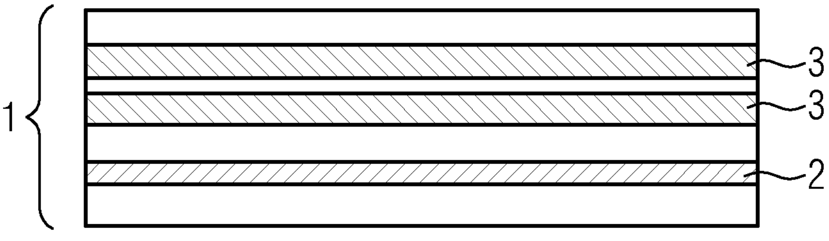

FIG. 1C shows a further embodiment of an optoelectronic semiconductor layer sequence 1. In contrast to FIG. 1A, in this embodiment, two filter layers 3 are arranged in the optoelectronic semiconductor layer sequence 1. The two filter layers 3 are arranged on one side of the active layer 2, but may also be arranged on different sides of the active layer 2.

Since a filter layer 3 absorbs high-energy photons and at least partially converts them into low-energy photons at or near the cutoff wavelength 14, the number of high-energy electron-hole pairs in the active layer 2 is reduced, for example by an order of magnitude. By introducing several filter layers 3 into the optoelectronic semiconductor layer sequence 1, the number of electron-hole pairs in the active layer 2 may be correspondingly reduced to a greater extent.

Figure 2A:
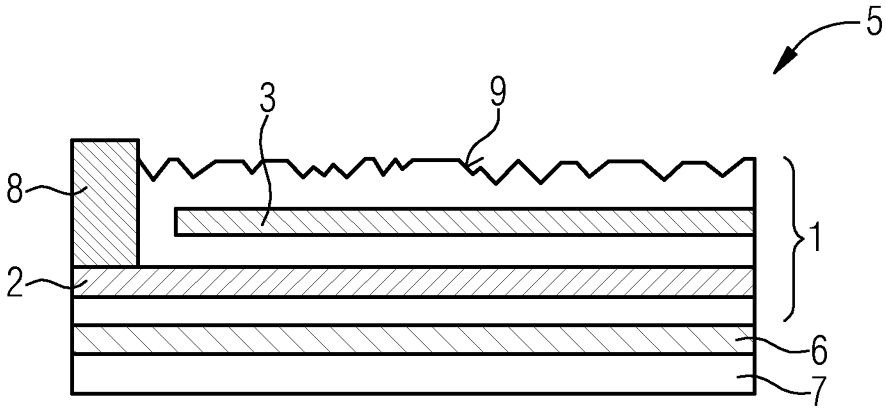
FIGS. 2A to 2C show schematic sectional views of semiconductor chips according to various embodiments.

FIG. 2A shows an embodiment of an optoelectronic semiconductor chip 5, which comprises a carrier substrate 7 with a mirror layer 6 arranged thereon. A semiconductor layer sequence 1 according to one embodiment is arranged thereon. The mirror layer 6 is configured to reflect electromagnetic radiation emitted by the active layer in the direction of the carrier substrate 7. In particular, the mirror layer 6 comprises a reflective layer sequence in the form of a dielectric Bragg reflector. Alternatively, the mirror layer 6 may comprise a metallic layer.

In order to increase the outcoupling efficiency of electromagnetic radiation generated during operation, the radiation outcoupling surface 9 of the optoelectronic semiconductor chip 5 is roughened in order to reduce total reflection of electromagnetic radiation at the radiation outcoupling surface 9. Since preferably no transport of electrical charge carriers occurs due to the filter layer 3, the active layer 2 is electrically contacted with a contact 8 which is electrically insulated from the filter layer 3.

Figure 2B:
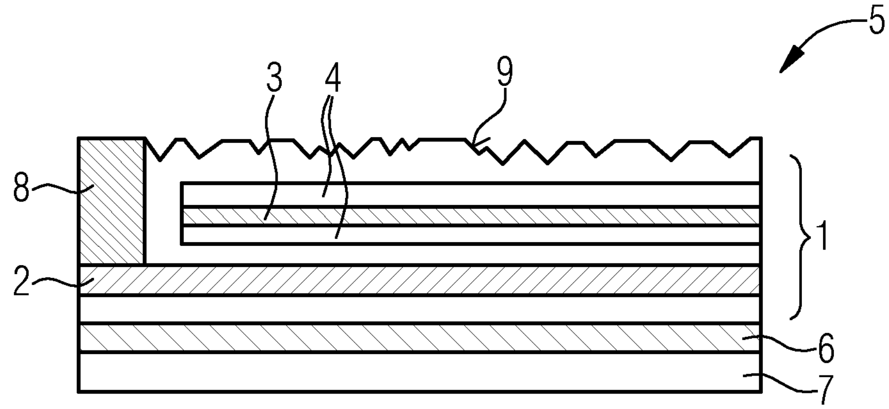

FIG. 2B shows an embodiment of an optoelectronic semiconductor chip 5, in which the filter layer 3 is arranged between two cladding layers 4. Due to the cladding layers 4, the optoelectronic semiconductor chip has a higher efficiency compared to the embodiment of FIG. 2A.

Figure 2C:
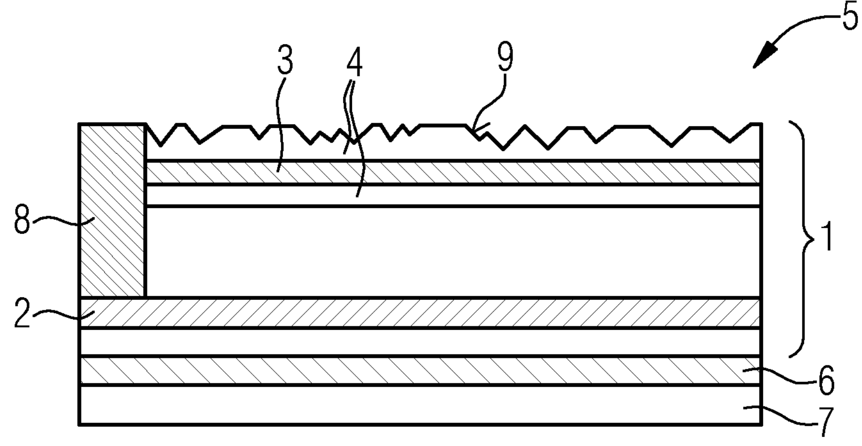

FIG. 2C shows a further embodiment of an optoelectronic semiconductor chip 5, in which, in comparison to the embodiment of FIG. 2B, a cladding layer 4 is arranged as the edge layer of the optoelectronic semiconductor layer sequence 1. In particular, the electromagnetic radiation generated during operation is coupled out of the optoelectronic semiconductor chip via a radiation outcoupling surface 9 of the cladding layer 4. The radiation outcoupling surface 9 of the cladding layer 4 is roughened in order to increase the outcoupling efficiency of electromagnetic radiation generated during operation.

Figure 3:
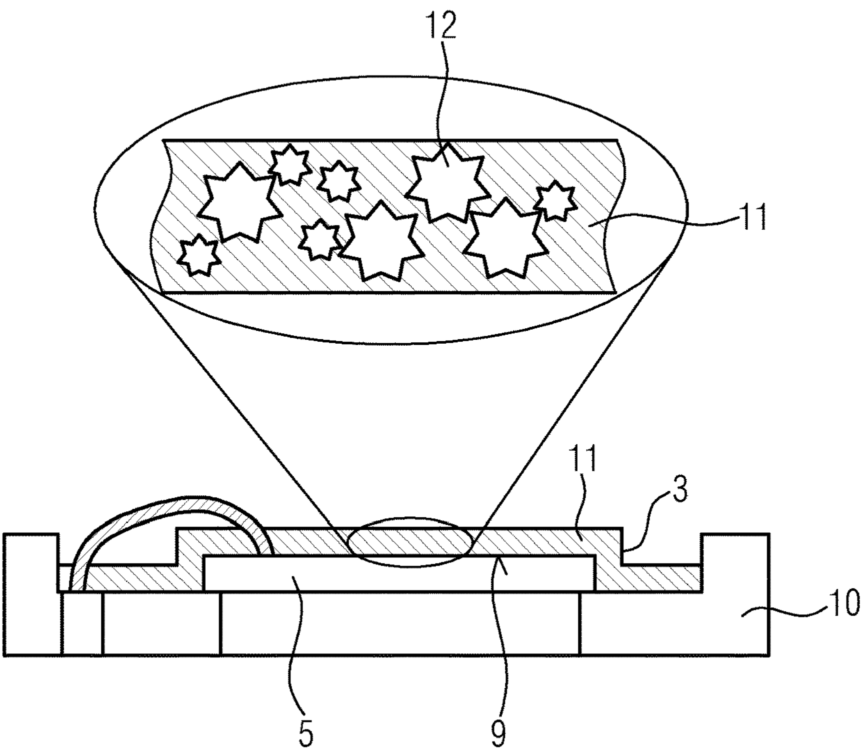
FIG. 3 shows a schematic sectional view of an optoelectronic semiconductor device according to one embodiment.

FIG. 3 shows a schematic sectional view of an optoelectronic semiconductor device according to an embodiment. The optoelectronic semiconductor device comprises a carrier 10 on which an optoelectronic semiconductor chip 5 for generating electromagnetic radiation is arranged, the chip comprising a radiation outcoupling surface 9. The optoelectronic semiconductor chip exhibits an emission spectrum 13 centered around a wavelength of approximately 940 nanometers and is electrically contacted via the carrier 10 and via a bonding wire. The surfaces of the optoelectronic semiconductor chip 5 that are not covered by the carrier 10 are covered by a filter layer 3. The filter layer 3 comprises a matrix material 11 in which semiconductor particles 12 are arranged. In this embodiment, the matrix material 11 is applied by a spray coating process. Alternatively, the matrix material 11 may be formed as a potting.

The semiconductor particles 12 have an average diameter of greater than 1 micrometer and comprise a semiconductor material having a direct band gap. The semiconductor particles 12 are configured to at least partially absorb electromagnetic radiation generated during operation in the visible spectral range. In particular, the cutoff wavelength 14 in this embodiment is 910 nanometers and the semiconductor particles comprise indium gallium arsenide with an indium content of 5%.

Figure 4:
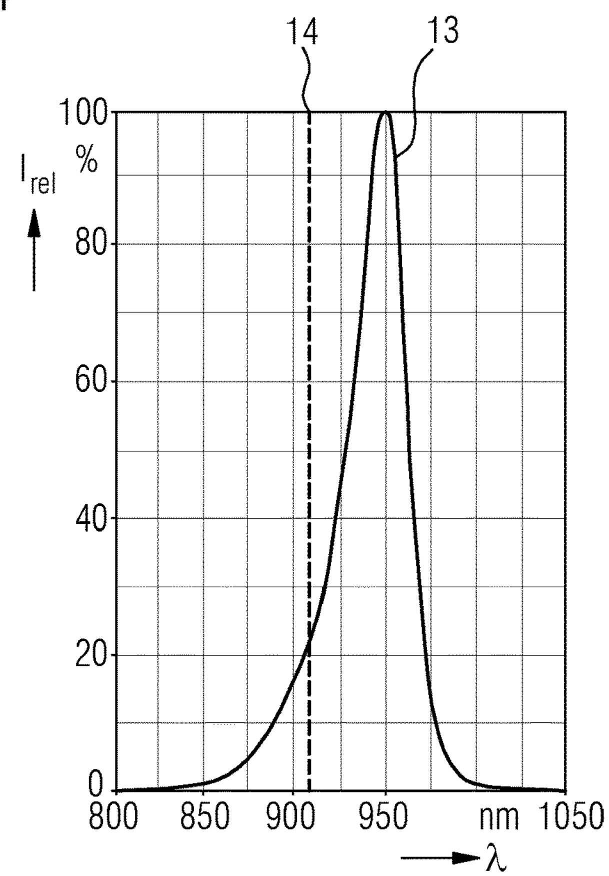
FIG. 4 shows a schematic emission spectrum of a light-emitting diode.

FIG. 4 shows a schematic emission spectrum 13 of a light-emitting diode, which is centered around a wavelength of approximately 940 nanometers. In particular, the intensity of the electromagnetic radiation emitted during operation is shown as a function of the wavelength. In this example, approximately 13% of the electromagnetic radiation is emitted at wavelengths smaller than a selected cutoff wavelength 14 of 910 nanometers. One concept of the optoelectronic semiconductor layer sequence 1 and the optoelectronic semiconductor device described herein is to reduce the emission of electromagnetic radiation of wavelengths smaller than the cutoff wavelength 14 by at least one order of magnitude by using a filter layer 3. The energy of the electromagnetic radiation absorbed by the filter layer 3 of wavelengths smaller than the cutoff wavelength 14 is at least partially converted into electromagnetic radiation at or near the cutoff wavelength 14. In particular, the electromagnetic radiation absorbed by the filter layer 3 is not entirely converted into heat. As a result, the efficiency of the optoelectronic semiconductor layer sequence 1 and the optoelectronic semiconductor device is increased.

The invention is not limited to the description with reference to the embodiments. Rather, the invention encompasses every new feature and every combination of features, in particular including every combination of features in the claims, even if this feature or this combination itself is not explicitly cited in the claims or embodiments.

The invention claimed is:

1. An optoelectronic semiconductor layer sequence comprising:

an active layer for generating electromagnetic radiation, and at least one filter layer configured to at least partially absorb the electromagnetic radiation generated by the active layer of wavelengths smaller than a predetermined cutoff wavelength, wherein the active layer and the at least one filter layer are formed to be monolithically integrated and the at least one filter layer is arranged between two cladding layers.

2. The optoelectronic semiconductor layer sequence according to claim 1, wherein the cutoff wavelength is between 900 nanometers and 925 nanometers inclusive.

3. The optoelectronic semiconductor layer sequence according to claim 1, wherein the at least one filter layer comprises a semiconductor material having a direct band gap.

4. The optoelectronic semiconductor layer sequence according to claim 3, wherein the direct band gap lies in a range corresponding to a wavelength of electromagnetic radiation between 100% and 103% inclusive of the cutoff wavelength.

5. The optoelectronic semiconductor layer sequence according to claim 1, wherein the at least one filter layer comprises $In_xGa_{1-x}As_yP_{1-y}$ with $0 \leq x \leq 1$ and $0 \leq y \leq 1$.

6. The optoelectronic semiconductor layer sequence according to claim 1, wherein the at least one filter layer has a thickness between 0.4 micrometers and 5 micrometers inclusive.

7. The optoelectronic semiconductor layer sequence according to claim 1, wherein the cladding layers have a larger band gap than the filter layer.

8. The optoelectronic semiconductor layer sequence according to claim 1, wherein the at least one filter layer is arranged between the active layer and a main surface of the optoelectronic semiconductor layer sequence, the main surface being configured to outcouple electromagnetic radiation generated during operation.

9. An optoelectronic semiconductor device comprising:

a carrier configured to electrically contact at least one optoelectronic semiconductor chip, at least one optoelectronic semiconductor chip arranged on the carrier, for generating electromagnetic radiation, the optoelectronic semiconductor chip comprising a radiation outcoupling surface, a filter layer arranged at least on the radiation outcoupling surface (9) and comprising a matrix material including semiconductor particles embedded therein, and the semiconductor particles being configured to at least partially absorb electromagnetic radiation generated during operation of a wavelength smaller than a cutoff wavelength.

10. The optoelectronic semiconductor device according to claim 9, wherein the filter layer is formed as a potting which covers all of the surfaces of the optoelectronic semiconductor chip that are not covered by the carrier.

11. The optoelectronic semiconductor device according to claim 9, wherein the cutoff wavelength is between 900 nanometers and 920 nanometers inclusive.

12. The optoelectronic semiconductor device according to claim 9, wherein the optoelectronic semiconductor chip comprises an optoelectronic semiconductor layer sequence.

13. The optoelectronic semiconductor device according to claim 9, wherein the semiconductor particles have an average diameter of more than 1 micrometer.

14. The optoelectronic semiconductor device according to claim 9, wherein the semiconductor particles comprise a semiconductor material having a direct band gap.

15. The optoelectronic semiconductor device according to claim 9, wherein the semiconductor particles comprise indium gallium arsenide or indium phosphide.

* * * * *